US007507649B2

(12) United States Patent
Werner et al.

(10) Patent No.: US 7,507,649 B2
(45) Date of Patent: Mar. 24, 2009

(54) METHOD FOR ELECTRICAL DOPING A SEMICONDUCTOR MATERIAL WITH CESIUM

(75) Inventors: Ansgar Werner, Dresden (DE); Tilmann Romainczyk, Dresden (DE)

(73) Assignee: Novaled AG, Dresden (DE)

( * ) Notice: Subject to any disclaimer, the term of this patent is extended or adjusted under 35 U.S.C. 154(b) by 80 days.

(21) Appl. No.: 11/241,477

(22) Filed: Sep. 30, 2005

(65) Prior Publication Data

US 2006/0079004 A1   Apr. 13, 2006

(30) Foreign Application Priority Data

Oct. 7, 2004   (EP) ................... 04023945

(51) Int. Cl.
H01L 21/22 (2006.01)
(52) U.S. Cl. ...................... 438/567; 438/565
(58) Field of Classification Search ............ 438/1, 438/99, 70, 510, 517, 542, 565, 567, 568
See application file for complete search history.

(56) References Cited

U.S. PATENT DOCUMENTS

| | | | |
|---|---|---|---|
| 3,644,770 A * | 2/1972 | Bell | 313/542 |
| 3,673,011 A * | 6/1972 | Strull | 438/20 |
| 4,066,569 A | 1/1978 | Lim | |
| 4,356,429 A | 10/1982 | Tang | |
| 4,618,453 A | 10/1986 | Kim | |
| 4,769,292 A | 9/1988 | Tang et al. | |
| 5,093,698 A | 3/1992 | Egusa | |
| 5,110,835 A | 5/1992 | Walter et al. | |
| 5,247,226 A | 9/1993 | Sato et al. | |
| 5,292,881 A | 3/1994 | Berneth et al. | |
| 5,556,524 A | 9/1996 | Albers | |
| 5,703,436 A | 12/1997 | Forrest et al. | |
| 5,736,881 A | 4/1998 | Ortiz | |
| 5,757,026 A | 5/1998 | Forrest et al. | |
| 5,811,833 A | 9/1998 | Thompson | |
| 5,834,893 A | 11/1998 | Bulovic et al. | |
| 5,840,217 A | 11/1998 | Lupo et al. | |
| 5,969,474 A | 10/1999 | Arai | |
| 6,013,384 A | 1/2000 | Kido et al. | |
| 6,046,543 A | 4/2000 | Bulovic | |
| 6,111,696 A | 8/2000 | Allen et al. | |
| 6,160,828 A | 12/2000 | Kozlov et al. | |
| 6,303,238 B1 | 10/2001 | Thompson et al. | |
| 6,310,360 B1 | 10/2001 | Forrest et al. | |
| 6,350,534 B1 | 2/2002 | Boerner et al. | |
| 6,406,804 B1 | 6/2002 | Higashi | |
| 6,414,661 B1 | 7/2002 | Shen | |
| 6,423,429 B2 | 7/2002 | Kido et al. | |
| 6,437,769 B1 | 8/2002 | Kobayashi | |
| 6,476,550 B1 | 11/2002 | Oda | |
| 6,501,230 B1 | 12/2002 | Feldman | |
| 6,555,840 B1 | 4/2003 | Hudson et al. | |
| 6,566,807 B1 | 5/2003 | Fujita et al. | |
| 6,573,651 B2 | 6/2003 | Adachi et al. | |
| 6,579,422 B1 | 6/2003 | Kakinuma | |
| 6,614,161 B1 | 9/2003 | Jacobsen | |
| 6,620,528 B1 * | 9/2003 | Yamazaki et al. | 428/690 |
| 6,630,684 B2 | 10/2003 | Lee | |
| 6,645,645 B1 | 11/2003 | Burroughes et al. | |
| 6,700,058 B2 | 3/2004 | Nelles et al. | |
| 6,720,573 B2 | 4/2004 | Son | |
| 6,734,457 B2 | 5/2004 | Yamazaki | |
| 6,747,287 B1 | 6/2004 | Toguchi et al. | |
| 6,835,470 B1 | 12/2004 | Magain | |
| 6,867,538 B2 | 3/2005 | Adachi | |
| 6,878,297 B1 | 4/2005 | Berger | |
| 6,897,473 B1 | 5/2005 | Burroughes et al. | |
| 6,900,588 B2 | 5/2005 | Adachi et al. | |
| 6,908,783 B1 | 6/2005 | Kuehl et al. | |
| 6,933,522 B2 | 8/2005 | Lin | |
| 6,965,197 B2 | 11/2005 | Tyan | |
| 7,001,536 B2 | 2/2006 | Thompson et al. | |
| 7,012,363 B2 | 3/2006 | Weaver | |
| 7,074,500 B2 | 7/2006 | Pfeiffer | |

(Continued)

FOREIGN PATENT DOCUMENTS

AU       2003229476        9/2003

(Continued)

OTHER PUBLICATIONS

Tang, C. W., et al., "Electroluminescence of doped organic thin films," Journal of Applied Physics, (1989), vol. 65:9, pp. 3610-3616.

(Continued)

*Primary Examiner*—Kevin M Picardat
(74) *Attorney, Agent, or Firm*—Sutherland, Asbill & Brennan, LLP

(57) ABSTRACT

The invention relates to a method for doping a semiconductor material with Cesium, wherein said semiconductor material is exposed to a cesium vapor. Said Cesium vapor is provided by Cesium sublimation from a Cesium alloy. There is also provided an organic light emitting diode comprising at least one layer of a Cesium doped organic semiconductor material, wherein said at least one layer of said Cesium doped organic semiconductor material is doped with Cesium provided by Cesium evaporation of Cesium from a Cesium alloy. The Cesium vapor is preferably provided by Cesium sublimation from a standard organic material deposition evaporator.

16 Claims, 2 Drawing Sheets

U.S. PATENT DOCUMENTS

| | | | |
|---|---|---|---|
| 7,141,817 | B2 | 11/2006 | Nishi |
| 7,161,292 | B2 | 1/2007 | Leo |
| 7,256,541 | B2 | 8/2007 | Birnstock |
| 2001/0026124 | A1 | 10/2001 | Yachin et al. |
| 2001/0035713 | A1 | 11/2001 | Kimusra |
| 2001/0038102 | A1 | 11/2001 | Takeo |
| 2001/0055841 | A1* | 12/2001 | Yamazaki et al. ............ 438/151 |
| 2002/0015807 | A1 | 2/2002 | Youichirou et al. |
| 2002/0084993 | A1 | 7/2002 | Teneya |
| 2002/0098379 | A1 | 7/2002 | Takashi |
| 2003/0062636 | A1 | 4/2003 | Guangji |
| 2003/0122813 | A1 | 7/2003 | Ishizuki |
| 2003/0127973 | A1 | 7/2003 | Weaver et al. |
| 2003/0146443 | A1 | 8/2003 | Atsushi et al. |
| 2003/0146888 | A1 | 8/2003 | Yamazaki |
| 2003/0164679 | A1 | 9/2003 | Takafumi et al. |
| 2003/0184505 | A1 | 10/2003 | Inukai |
| 2004/0012980 | A1 | 1/2004 | Sigiura et al. |
| 2004/0066824 | A1 | 4/2004 | Magno |
| 2004/0070558 | A1 | 4/2004 | Cok |
| 2004/0113547 | A1 | 6/2004 | Son |
| 2004/0183963 | A1 | 9/2004 | Nakamura |
| 2004/0227446 | A1 | 11/2004 | Akira et al. |
| 2004/0251816 | A1 | 12/2004 | Leo et al. |
| 2005/0040390 | A1 | 2/2005 | Pleiffer et al. |
| 2005/0061232 | A1 | 3/2005 | Werner et al. |
| 2005/0110009 | A1 | 5/2005 | Biochwitz-Nimoth et al. |
| 2005/0142379 | A1 | 6/2005 | Noriyuki |
| 2005/0145179 | A1* | 7/2005 | Cattaneo et al. ............. 118/726 |
| 2005/0236973 | A1 | 10/2005 | Leo et al. |
| 2005/0280766 | A1 | 12/2005 | Johnson et al. |
| 2006/0033115 | A1 | 2/2006 | Blochwitz et al. |
| 2006/0044227 | A1 | 3/2006 | Hadcock |
| 2006/0050032 | A1 | 3/2006 | Gunner et al. |
| 2006/0071206 | A1 | 4/2006 | Stossell et al. |
| 2006/0231843 | A1 | 10/2006 | Qin et al. |

FOREIGN PATENT DOCUMENTS

| | | |
|---|---|---|
| CA | 2463377 | 8/2003 |
| DE | 19732828 | 2/1999 |
| DE | 19916745 | 10/2000 |
| DE | 1009204 | 8/2001 |
| DE | 10135513 | 2/2003 |
| DE | 10207859 | 9/2003 |
| DE | 10229231 | 1/2004 |
| DE | 10251986 | 5/2004 |
| DE | 10261609 | 8/2004 |
| DE | 10307125 | 8/2004 |
| EP | 0625843 | 11/1994 |
| EP | 1018718 | 7/2000 |
| EP | 1227466 | 7/2002 |
| EP | 1282101 | 2/2003 |
| EP | 1318499 | 6/2003 |
| EP | 1365633 | 11/2003 |
| EP | 1476881 | 11/2004 |
| EP | 1548856 | 6/2005 |
| GB | 239203 | 2/1926 |
| GB | 2361356 | 10/2001 |
| GB | 2388236 | 11/2003 |
| GB | 2390215 | 12/2003 |
| JP | 59031865 | 2/1984 |
| JP | 2004119197 | 4/2004 |
| WO | 9948160 | 9/1999 |
| WO | 0108230 | 2/2001 |
| WO | 0127910 | 4/2001 |
| WO | 0193642 | 12/2001 |
| WO | 0237580 | 5/2002 |
| WO | 0241414 | 5/2002 |
| WO | 02093664 | 11/2002 |
| WO | 03061028 | 7/2003 |
| WO | 03069958 | 8/2003 |
| WO | 03070822 | 8/2003 |
| WO | 03088271 | 10/2003 |
| WO | 03094140 | 11/2003 |
| WO | 04025615 | 3/2004 |
| WO | 04059606 | 7/2004 |
| WO | 05086251 | 9/2005 |

OTHER PUBLICATIONS

Tobat P., I. Saragi et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo, et al., "Improvement of emission effciency in polymer light-emitting devices based on phosphorescenct polymers," Thin Solid Films, Dec. 15, 2003, vol. 445, No. 2, pp. 353-357.

Tong B. Tang et al., "Ionization thresholds of merocyanine dyes in the solid state," Journal of Applied Physics, vol. 59, (1), Jan. 1986, pp. 5-10.

Tsujimura, T., et al., SID 03 Digest, "A 20-inch OLED display driven by super-amorphous-silicon technology," pp. 6-9.

Tsutsui, Tetsuo, et al., "High quantum efficiency in organic light emitting devces with iridium-complex as a triplet emissive center," Jps. Journal of Applied Physics, part 2 letters, (1999), vol. 38:12B, pp. L1502-L1504.

Von Jurgen Kauphold, Ber. Bunsen. Phys. Chem. 69, pp. 168-179.

W. B. Jensen, The Generalized Lewis Acid Based Concepts, John Wiley & Sons, New York, 1980, pp. 113-195.

Werner, Ansgar et al., "N-Doping of organic semiconductors," U.S. Appl. No. 10/595,319 (Pub. No. 20070278479).

Werner, Ansgar et al., "Soped organic semiconductor material," U.S. Appl. No. 11/315,072 (Pub. No. 20070145355).

Weiying Gao et al., "Effect of electrical doping on molecular level alignment at organic-organic heterojunctions," Applied Physics Letters, vol. 82, No. 26, Jun. 30, 2003, pp. 4815-4817.

Wenping Hu et al., "Efficient red electroluminescence from devices having multilayers of a europium complex," Appl. Phys. Lett. vol. 77, No. 26, Dec. 25, 2000.

X. Zhou et al., "Low-voltage inverted transparen vaccun deposited organic light-emitting diodes using electrical doping," Applied Physics Letters, vol. 81, No. 2, Jul. 29, 2002, pp. 922-924.

X. Zhou et al., "Very low operating voltage organic light-emitting diodes using amorphous hole injection layer," Applied Physics Letters, vol. 78, No. 4, Jan. 22, 2001, pp. 410-412.

Yamasaki, T et al., "Organic Light emiting device with an ordered monolayer of silica microspheres as a scattering medium," Appl. Phys. Lett., vol. 76, pp. 1243-1245, Mar. 2000.

Yao Fu et al., "Quantum-Chemical prediction of Absolute standard redox potentials of diverse organic molecules and free radicals in acetonitrile," J. Am. Chem. Soc. 2005, 127, pp. 7227-7234.

Yasuhiko Shirota et al., "A novel class of emitting amorphous molecular materials as bipolar radical formants: 2-{4-[bis(4-methylphenyl)amino]phenyl}-5-(dimesitylboryl)thiophene) and 2-{4-[bis(9,9-dimethylfluorenyl)amino]phenyl}-5-(dimethylboryl)thiophere," Journal of the American Chemical Society, 2000, vol. 122, pp. 11021-11022.

Yasuhiko Shirota, "Organic materials for electronic and optoelectronic devices," Journal of Materials Chemistry, 2000, vol. 10, pp. 1-25.

Yersin, H. and Douges, D., Topics in Curr. Chem. 2001, 214, 81.

Zhi-Ming Zhang, "Organic light emitting diodes based on new oxadiazole and pyrazoline derivatives," Ching Physics Letters, 2000, vol. 17, No. 6, pp. 454-456.

Zhou C. et al., "Modulation chemical doping of individual carbon nanotubes," Science, American Association for the Advancement of Science, vol. 290, No. 5496, pp. 1552-1555.

Ahou, X., et al., "High-efficiency electrophosphorescent organic light-emitting diodes with double light-emitting layers," Applied Physics Letters, Nov. 18, 2002, vol. 81, No. 21, pp. 4070-4072.

A. G. Werner, et al., "Pyronin B as a donor for n-type doping of organic think films," Applied Physics Letters, Vol. 82, No. 25, Jun. 25, 2003, pp. 4495-4497.

A. J. Bard, L. R. Faulkner, Electrochemical Methods: Fundamentals and Applications, Wiley, 2nd Ed., 2000, pp. 52-55, Appendix C pp. 808-813.

A. Nollau et al., "Controlled n-type doping of a molecular organic semiconductor: naphthalenetetracarboxylic dianhydride (NTCDA) doped with bis(ethylenedithio)-tetrathiafulvalene (BEDT-TTF)," J. Appl. Phys., vol. 87, No. 9, May 1, 2006, pp. 4340-4343.

A. P. Kulkarni et al., "Electron transport materials for organic light-emitting diodes," Chem. Mater. 2004, 16, pp. 4556-4573.

Adachi C. et al., "High-efficiency organic electrophorescent devices with tris (2-phenylpyridine) iridium doped into electron-transporting materials,", App. Phys. Lett. vol. 77, No. 6, Aug. 7, 2000.

Adachi, Chihaya, et al., "Efficient electrophosorescence using a doped ambipolar conductive molecular organic thin film," Organic Electronics 2, (2001), pp. 37-43.

Adachi, chihaya, et al., "Nearly 100% internal phosphorescene effciency in an organic light emitting device," Journal of Applied Physics (2001), vol. 90:10, pp. 5048-5051.

Ammermann, Dirk, Dirk et al., "Photonic devices based on crystalline organic semiconductors for optoeletronic integrated circuits," Jps. J. Appl. Phys. Pt. 1 (1995) vol. 34, pp. 1293-1297.

B. A. Gregg et al., "On the superlinear increase in conductivity with dopant concentration in excitonic semiconductors," Applied Physics Letters, vol. 84, No. 10, Mar. 8, 2004, pp. 1707-1709.

B. Maennig et al., "Organic p-i-n solar cells, App. Phys. 2004, A 79, pp. 1-14.".

B.W. D'Andrade et al., "Relationship between the ionization and oxidation potentials of molecular organic semiconductors," Organic Electronics 6, 2005, pp. 11-20.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, Marc, et al., "Organic vapor phase deposition," Advances materials, 1998, 10, No. 18, pp. 1505-1514.

Bastard, G., "Wave Mechanics applied to semiconductor heterostructures," The Editors of Physique, (1988) pp. 64-67.

Blochwitz, J. et al., Org. Electronics 2, 97 (2001).

Blochwitz, J. et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphus hole transport layer and operating voltages down to 3.2 V to achieve 100 cd/m2," Synthetic Matals, (2002), vol. 127, pp. 169-173.

Bloom, C. J. et al., "Low work function reduction metal complexes as cathodes in organic electroluminescent devices," J. of Physical Chemistry B, vol. 107, No. 13, pp. 2933-2938.

Burroughes, J. H., et al., "Light-emitting diodes based on conjugated polymers," Nature, vol. 347, Oct. 11, 1990, pp. 539-541.

C.W. Tang et al., "Organic electroluminescent diodes," Applied Physics Letters, vol. 51, No. 12, Sep. 21, 1987, pp. 913-915.

Campbell, Alasdair, J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chassot L. and Von Zelewsky A., Inorg. Chem., 26, 281 (1987).

Chimed Ganzorg et al., "p-Typed Semiconducts of Aromatic Diamines Doped with SbCl5," Chemistry Letters 2000, pp. 1032-1033.

Chung-Chih Wu et al., "Efficient organic blue-light-emitting devices with double confinement on terfluorenes with ambipolar carrier transport properties," Advanced Materials, Jan. 5, 2004, vol. 16, No. 1, pp. 61-65.

Connelly, N. G. et al., Chem. Rev., 96, 877 (1996).

D. Oeter et al., "Doping and Stability of Ultrapure alpha-oligothiophene Thin Films," Synthetic Metals, 61, 1993, pp. 147-150.

D'Andrade, Brian W., "Operationa Stability of electrophosphorescent devices containing p and n doped transport layers," Applied Physics Letters, vol. 83, No. 19, Nov. 10, 2003, pp. 3858-3860.

D'Andrade, Brian W, et al., "Efficient organic electrophosphorescent white-light emitting device with a triple doped emissive layer," Advanced Materials, No. 7, 16, Apr. 5, 2004, pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Deluca, Mark et al., "The p-toluenesulfonic acid promoted synthesis of 2-substituted benzoxazoles and benzimidazoles from diacylated precursors," Tetrahedron, vol. 53, No. 2, pp. 457-464, 1997.

Du-Zen Peng et al., "P-143: Novel Pixel Compensation Circuit for Amoled Display," 2005 SID International Symposium, SID 05 Digest, San Jose, CA May 24, 2005, pp. 814-817.

Elwell, D., "Electrocrystallization of semiconducting materials from molten salt and organic solutions," Journal of Crystal Growth, vol. 52, 1981, pp. 741-752.

Fenghong Li et al., "Leuco Crystal Violet as a dopant for n-doping of organic thin films of fullerence C60," J. Phys. Chem. B 2004, 108, pp. 17076-17088.

G. D. Sharma et al., "Influence of Iodine on the Electrical and Photoelectrical Properties of Zinc Phthalocyanine Think Film Devices," Materials Science and Engineering, B41, 1996, pp. 222-227.

G. Klopman, "Chemical Reactivity and the Concept of Charge-and Frontier-conteolled reactions," Journal of the American Chemical Society., vol. 90, No. 2, Jan. 17, 1968, pp. 223-234.

G. Parthasrthy, et al., "Lithium doping of semiconductor organic charge transport materials," J. Appl. Phys., vol. 89, No. 9, May 1, 2001, pp. 4986-4992.

Gao Y. et al., "Cs doping and energy level shift in CuPC", Chemical Physics Letters. North-Holland, Amsterdam, NK, vol. 380, OCt. 21, 2003, p. 451-455.

Grimmett M. Ross, "Imidazole and benzimidazole synthesis," Tables of Contents, pp. 1-10, Academic Press, Harcourt Brace & Company, Publishers, London, San Diego, NY, Boston et al., 1997.

Gu, G., et al., "Transparent organic light emitting devices," Applied Physics Letters, (1996), vol. 68:19, pp. 2606-2608.

Guefeng He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hararada Kentaro et al., "Realization of organic pn-homojunction using a novel n-type doping technique," Proceedings of SPIE-The international Society for Optical Engineering; Organic Optoelectronics and Photonics 2004, vol. 5464, Sep. 2004, pp. 1-9.

Heinze, Jurgen et al., "Polarographic studies of the conformation of 1,2,3,4,5-pentaarylimidazolium cations," The Institute for Physical Chemistry at the University of Freiburg, pp. 1-22, 1972.

Hideyuki Murata, et al., "efficient organic light-emitting diodes with undoped active layers based on silole derivatives," Applied Physics Letters, Jan. 14, 2002, vol. 80, No. 2, pp. 189-191.

Hino Yuichi, et al., "Efficient low molecule phosporescent organic light emitting diodes fabricated by wet-processing," Organic Electronics, Aug. 8, 2004, vol. 5, pp. 265-270.

Huang, Jingsong, et al., "Effect of well number on organic multiple-quantum-well electroluminescent device characteristics," Applied Physics Letters, (1998), vol. 73:23, pp. 3348-3350.

Huang, Jingsong, et al., "Influence of the thickness and doping of the emission layer on the performance of organic light-emitting diodes with PiN structures," Journal of Applied Physics, (2003), vol. 93:2, pp. 838-844.

Huang, Jinsong, et al., "Low operating and high-efficiency organic multilayer electroluminescent devices with p-type doped hole injection layer," Jps. J. Appl. Phys., (2001), vol. 40, pp. 6630-6633.

Hung, L. S., et al., "Recent progress of molecular organic electroluminrscent materials and devices," Materials Science and Engineering Reports, 39, 2002, pp. 143-222.

Ikai, M. et al., "Highly Efficient Phosphorecence From Organic light-emitting devices with an exciton-block layer," Appl. Phys. Lett. vol. 79, No. 2, Jul. 9, 2001.

Loannidia, A., et al., "Hole and electron transport in chloroaluminum phtalocyanin think films," The Journal of Physical Chemistry B, 1997, vol. 101, pp. 5100-5107.

Ishii, M. et al., J. Lumin., 1165 (2000).

J.D. Anderson et al., "Electrochemistry and Electrgenerated Chemiluminescence Processes of the Componenets of Aluminum Quinolate/Triarylamine, and Related Organic Light emitting Diodes," J. Am. Chem. Soc., 1998, 120, pp. 9646-9655.

Jefferson, Alan M. and Suschitzky, H., "New Route to Nucleophillically Substituted o-phenylenediamines," J. C.S. Chem. Comm. pp. 189-190, 1997.

Jingson Huang et al., "Low-voltage organic electroluminescent devices using pin structures," Applied Physics Letters, vol. 80, No. 1, Jan. 7, 2002, pp. 139-141.

Uchida Masahiro, JP Patent Abstracts, vol. 2003, No. 12, Dec. 5, 2003.

Juno Endo et al., "Organic Electroluminescent Devices with a vacuum-deposited Lewis Acid doped hole injection layer," Japan Society of Applied Physics, vol. 41, 2002, pp. L358-L360, Part 2, No. 3B, Mar. 15, 2002.

Junji Kido et al., "Bright Organic Electroluminescent Devices Having a Metal-doped Electron-injecting Layer," Applied Physics Letters, vol. 73, No. 20, Nov. 16, 1998, pp. 2866-2868.

Juni Kido, "Recent progress in organic light-emitting devices," Proceedings of the 1st International Display Manufacturing Conference IDMC 2000, Seoul Korea, Sep. 5, 2000, pp. 399-400.

Katsuyuki Naaito, et al., "Molecular design, synthesis, and physical properties of nonpolymeric amorphous dyes for electron transport," The Journal of Physical Chemistry A, 1997, vol. 101, pp. 2350-2357.

Kin-Ya Akiba, et al., "Direct Synthesis of 2,2-diaryl-3-methyl-2,3-dihydrobrnzothiazoles from 3-methyl-2,3-dihydrobenzothiazole-2-thione and some mechanistic aspects," Bulletin of the Chemical Society of Japan, vol. 52(1), pp. 156-159, 1979.

Kwong, Raymond C., et al., "High operational stability of electrophosphorescent devices," Applied Physics Letters, Jul. 1, 2002, vol. 81, No. 1, pp. 162-164.

L.L. Miller et al., "A simple comprehensive correlation of organic oxidation and ionization potentials," J. Org. Chem., 1972, vol. 37, No. 6, pp. 916-918.

Lampert, M.A., Rep. Progr, Phys. 27, 329 (1964).

Lih, J., et al., SID 03 Digest, "A phosphorescent active-matrix OLED display driven by amorphous silicon backplane," pp. 14-17.

Lo, K. M., et al., J. Organimetal. Chem. 1992, 430, 149.

Ludvik, J. and Pragst, F. et al., "Electrochemical generation of triplet states," Journal of Electroanalytical Chemistry, No. 180, pp. 141-156, 1984.

Lupton, J. M. et al., "Bragg scattering from periodically microstructured light emitting diodes," Appl. Phys. Lett., vol. 77, pp. 3340-3342, Nov. 2000.

M. Maitrot et al., "Molecular material based junctions: Formation of a Schottky Contact with Metallophthalocyanine Think Films Doped by the Cosublimation Method," J. Applied Physics, 60(7), Oct. 1, 1986, pp. 2396-2400.

M. Pfeiffer et al., "Controlled doping of phthalocyanine layers by cosublimation with acceptor molecules: A systematic Seebeck and conductivity study," Applied Physics letters, vol. 73, No. 22 Nov. 20, 1998, pp. 3202-3204.

Macleod, H. A., Think Film Optical Fibers, 3rd. Ed., IOP Publishing, 2001, pp. 191-192.

Madigan, C.F., "Improvement of Output coupling efficiency of organic light emitting diodes by backside substrate modification," appl. Phys. Lett., vol. 76, pp. 1650-1652, Mar. 2000.

Massimo Curini Cirini, et al., "Ytterbium Triflate Promoted Synthesis of Benzimidazole Derivatives," Synlett, No. 10, pp. 1832-1834, 2004.

Matsumura M., et al., Applied Physics Letters, 2872 (1998).

Mattoussi, Hedi, et al., "Photoluminescence quantum yield of pure and molecularly doped organic solid films," Journal of Applied Physics, (1999), vol. 86:5, p. 2642.

Mori, T., et al., "Electroluminescence of organic light emitting diodes with alternately deposited dye-doped aluminum quinoline and diamine derivative," Journal of Physics D - Applied Physics, (1999), vol. 32:11, pp. 1198-1203.

Ohmori, Yutaka, et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka, et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assiging Values to Energy Changes of Electrode Reactions," Journal of the American Chemical Society, 96:17, Aug. 21, 1974, pp. 5656-5661.

Parthasarathy, G. et al., "High-efficiency transparent light-emitting devices," Applied Physics Letters, vol. 76, 15, Apr. 10, 2000, pp. 2128-2130.

Pfeiffer M, et al., "Doped Organic semiconductors: physicis and application in light emitting diodes," Organic Electronics, Elsevier, Amsterdam, NL, vol. 4, No. 2/3, Sep. 2003 (Sep. 2003), pp. 80-103, XP001177135, ISSN: 1556-1199.

Pfeiffer, Martin, et al., "Electrophosphorecent p-i-n organic light-emitting devices for very-high-effciency flat-panel displays," Advacned Materials, (2002), vol. 14:22, Nov. 18, 2002, pp. 1633-1636.

Ping Lu et al., "Synthesis of octasubstituted cycloctatetrainees and their use as electron transporters in organic light emitting diodes," Journal of the American Chemical Society, 2000, vol. 1222, pp. 7480-7486.

Pope, et al., "Single postivie or negative carriers in organic crystals," Electronic Processes in Organic Crystals and Polymers, Oxford Science Publications, Oxford University Press, (1999), pp. 202-207.

Pudzich, R., et al., "Synthesis and characterization of new oxadizoleamine based spiro-linke fluorescence dyes," Synthetics Metals, 2003, vol. 138, pp. 21-31.

Quast, Helmut and Schmitt, Edeltraud; "Note Regarding the Quaternization of Heterocycles," Institute of Organic Chemistry at the University of Wurzburg, 101, pp. 4012-4014, 1968.

R. Schlaf et al., "Homo/Lumo Alignment at PTCDA/ZnPc and PTCDA/ClInPc Heterointerfaces Determined by Combined UPS and XPS Measurements," J. Phys, Chem. B 1999, 103, pp. 2984-2992.

R.C. Haddon et al., "Conducting films of C60 and C70 by alkali-metal doping," Nature, vol. 350, Mar. 28, 1991, pp. 320-322.

Redecker, M., et al., "Electron transport in starbusrt phenylquinoxalines," Applied Physics Letters, Jul. 5, 1999, vol. 75, No. 1, pp. 109-111.

S. Hamm, "Rectifying organic junctions of molecualr assemblies based on perylene ion salts," J. Chem. Phys., vol. 103, No. 24, Dec. 22, 1995, pp. 10689-10695.

Sakamoto, Gosuke, et al., "Significant improvement of device durability in organic light-emitting diodes by doping both hole transport and emitter layers with rubrene molecules," Applied Physics Letter, (1999), vol. 75:6, pp. 766-768.

Sanford, J.L., et al., SID 03 Digest, "TFT amoled pixel circuits and driving methods," pp. 10-13.

Sato, N., et al., J. Chem. Soc. Faraday Trans. 3, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Stephen F. Nelssen, "Heterocyclic Radical Anions. II. Naphthalic and 1,4,5,8-Naphthalenatetracarboxylic Acid Derivatives," Journal of the American Chemical Society, 89:23, Nov. 8, 1967, pp. 5925-5931.

Takashi Muramatsu, et al., "Preparation and Properties of a novel heterocyclic dispiro compound, 3, 10-diaza-N, N-dimethyldispiro[5.0.5.3]pentedeca-1,4,8,11-tetraene," Chemistry Letters, pp. 151-152, 1996.

* cited by examiner

METHOD FOR ELECTRICAL DOPING A SEMICONDUCTOR MATERIAL WITH CESIUM

Cross-Reference to Related Application

Applicants hereby claim priority under 35 U.S.C. 119(a) to European Patent Application No. 04023945.1, filed Oct. 7, 2004.

The invention relates to a method for electrical doping a semiconductor material with Cesium, and an organic light emitting diode (OLED) comprising at least one layer of a Cesium doped semiconductor material. Electrical doping a semiconductor material means the admixture of dopant molecules to the semiconductor materials to increase the conductivity of the semiconductor material by increasing the intrinsic charge carrier density on the semiconductor material.

BACKGROUND OF THE INVENTION

Such doped semiconductor layers are for example used in organic light emitting diodes. Doping of electron transport layers (ETL) in organic light emitting diodes using alkali metals is an established technique to improve the power efficiency of such devices. Due to the unavailability of sufficiently strong molecular donors, alkali metals are used as donor atoms. Among the alkali metals, Cesium (Cs) is frequently used because it gives the highest stability of OLED with such doped ETL. Organic semiconductors are referred to as electron transport materials if whether their electron mobility is higher than their hole mobility, or their electron mobility is bigger than 1E-6 cm2/Vs (in the relevant field range of around 1-100E5V/cm). The ETL materials needs to be stable against reduction to support electron current over a long time. The energetic position of the lowest unoccupied molecular level (LUMO) is in the range from 2.4 eV to 3.8 eV, preferably 2.4 to 3 eV.

Currently, the only possibility to provide Cs vapor for doping purposes is the use of so called getter sources provided by S.A.E.S. getters. In these sources, $Cs_2CrO_4$ or $Cs_2MoO_4$ salts are decomposed by thermolysis and the released vapor guided through getter materials which removes the oxygen from the gas phase. After passing the getter, pure Cs vapor is released.

There are several drawbacks combined with this type of source. The sources need very high operating temperatures to carry out thermolysis. The container of the source achieves temperatures above 400° C. during operating, while the content is heated even more. This causes extra effort for cooling of the vacuum chamber. Due to strong gas adsorption at the getter material, severe degassing is observed during heat up, especially when the source was exposed to air beforehand. It takes a long time (ten min) until the Cs dispenser releases Cs vapor. Another ten minutes has to pass before the Cs evaporation rate is sufficiently stable. No rate is observed at quartz microbalances placed over the dispenser even when the former is water cooled. This is a major obstacle to process control. Checks for the proper operation of the source have to be carried out on a regular basis, which reduces the throughput of the vacuum chamber and adds to maintenance time and effort. Due to the complicated arrangement of the various components of such a source, it geometry flexibility is restricted, resulting in space demanding set-ups and limited evaporation characteristics. Finally, at least for $Cs_2CrO_4$, health and environmental risks are imminent due to the high toxicity of that compound.

SUMMARY OF THE INVENTION

Figure 1:
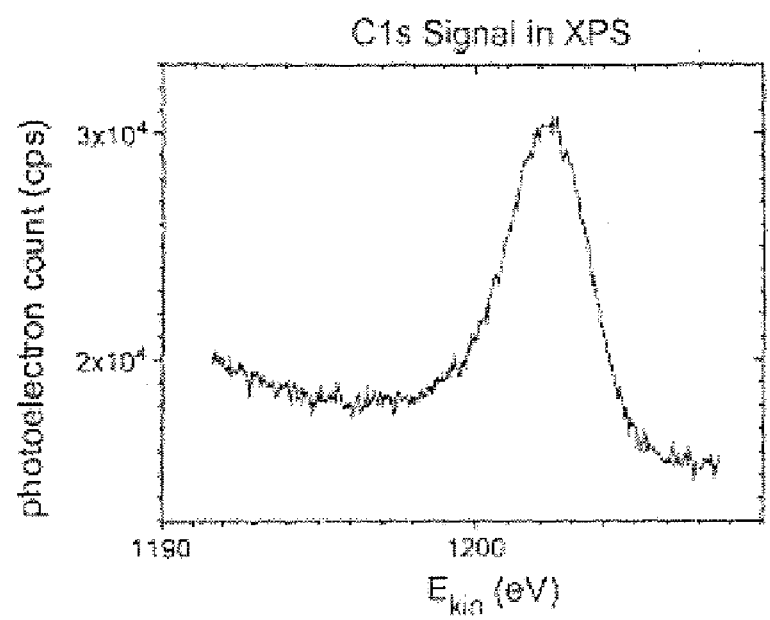
FIG. 1 is a graph depicting a C1s signal in XPS, wherein the photoelectron count is plotted against $E_{kin}$ (eV).

It is the object of the invention to provide a method for electrical doping a semiconductor material with Cesium, where electrical doping can be performed in a more simple fashion with improved process control.

According to one aspect of the invention a method for electrical doping a semiconductor material with Cesium is provided, wherein said semiconductor material is exposed to a Cesium vapor. Said Cesium vapor is provided by Cesium sublimation from a Cesium alloy.

According to another aspect of the invention an organic light emitting diode is provided, wherein said organic light emitting diode comprising at least one layer of a Cesium doped organic semiconductor material and said at least one layer of said Cesium doped organic semiconductor material being doped with Cesium provided by Cesium evaporation of Cesium from a Cesium alloy.

The invention provides the advantage that Cesium sublimation for electrical doping a semi-conductor material is easier to control, since controlling and measuring of the sublimation rate is improved. Overall controlling of the process of electrical doping is more reliable.

Advantageous developments of the invention are disclosed in dependent claims.

DESCRIPTION OF PREFERRED EMBODIMENTS OF THE INVENTION

Following the invention will be described in further detail, by way of example, with reference to different embodiments.

A method for doping a semiconductor material with Cesium (Cs) is described, wherein said semiconductor material is exposed to a cesium vapor. Said Cesium vapor is provided by Cesium sublimation from a Cesium alloy. Preferably GaCs alloys offer a possibility to provide Cs vapor. Here, Cs is released from the surface of the alloy at moderate temperatures. Simultaneously, further Cs diffuses through the core to the surface. The evaporation proceeds with a constant sublimation rate for a given temperature until finally the Cs content is used up. Under appropriate conditions, a thin shell of pure Ga is produced covering the air-sensitive GaCs core. In that instance, the GaCs pieces can be handled in air at least for several tens of minutes without degradation, means a negative effect on the doping capability of the Cs vapor.

The cesium evaporation takes place already at moderate temperatures around 300° C. It is possible to measure a Cs rate on a water cooled quartz microbalance. The source operation is quick. Stable Cs rate are provided by temperature control. Standard evaporators for organic materials can be used to evaporate the GaCs alloy.

In an embodiment a Bathopbenanthroline (BPhen) layer shows an increase in conductivity, when it is exposed to vapor released by the GaCs alloy. BPhen is a well known electron transport material in the OLED field and can be easily doped with Cs.

In the course of the experiments, it was noted that the quartz microbalance (QMB1) usually used to monitor the evaporation of molecular compounds display a stable evaporation rate during the operation of the GaCs alloy evaporator. When the evaporation temperature is operated at a stable temperature, a constant rate is observed over time. This is in contrast to the observation for S.A.E.S. Cs dispensers, where no stable rates were observed.

Calibration of the evaporation was performed. For this purpose, a second quartz microbalance (QMB2) is placed at the position of the sample. By comparison of the rates measured by QMB2 with QMB1, the geometric tooling factor can be determined It was observed that QMB2 displayed a rate decreasing with time while the evaporator was operated at a stable temperature and QMB1 showed a stable rate. The reason for the differing behavior is most likely the fact that QMB 1 is water cooled, while the uncooled QMB2 may heat up during operation. This could reduce the sticking coefficient of the Cs atoms impinging on the quartz surface. Calibration of the source was than attempted using surface analysis of a Cs doped organic film using X-ray photoelectron spectroscopy (XPS).

In a further embodiment, two samples of Cs doped films were prepared by co-evaporation on Au substrates. As matrices, metal complexes have been employed. The XPS signal of the corresponding metal atoms gives further information on the stoichiometry of the film. Both films have a nominal doping concentration of 1.8:1 (ratio Cs to matrix material), as determined by the measured evaporation rates and assuming the tooling factor for the Cs evaporator to be similar to values found earlier for molecular dopants.

Figure 2:
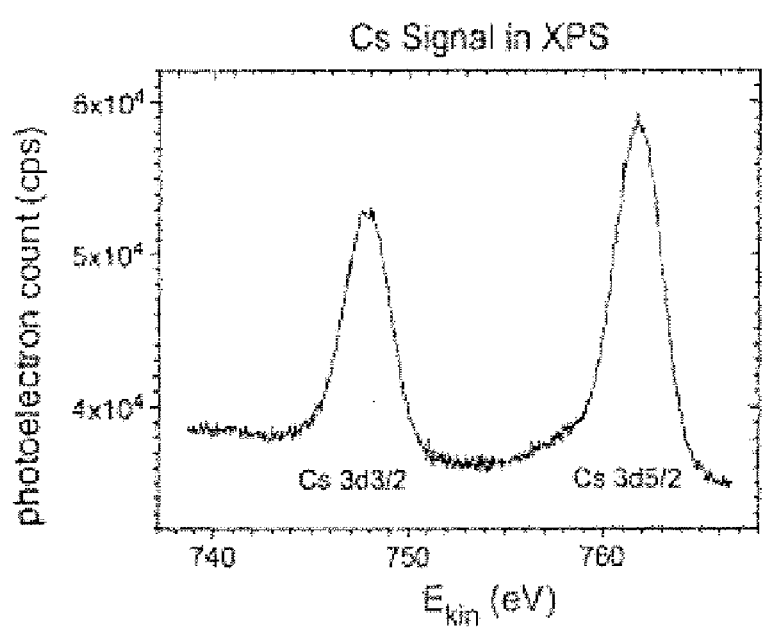
FIG. 2 is a graph depicting a Cs signal in XPS, wherein the photoelectron count is plotted against $E_{kin}$ (eV).
Figure 3:
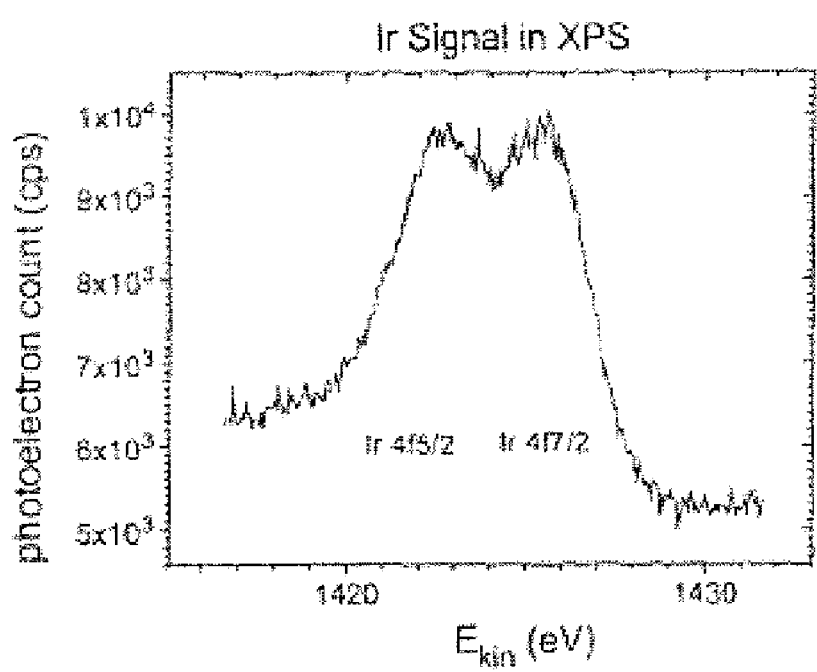
FIG. 3 is a graph depicting an Ir signal in SPX, wherein the photoelectron count is plotted against $E_{kin}$ (eV).

The films were transferred to the XPS analysis chamber through air. Consequently, a sputtering step has been carried out to remove over-layers of adsorbed gas. XPS spectra were recorded for Al Kα irradiation (1486.61eV). In FIG. 1 to 3 representative peaks XPS for a Cs:Ir(ppy)$_3$ sample are depicted. Ir(ppy)$_3$ (Tris(2-pbenylpyridine) iridium) is not a dopable electron transport matrix material for OLEDs but serves here as a reference molecule which Iridium central atom can be easily detected by XPS. No XPS signal from Ga was detected. After background subtraction, the areas of the various peaks were determined. These areas need to be corrected for the elemental sensitivity factors specific for the spectrometer and the escape depth variation with the kinetic energy of the photoelectrons. Table 1 summarizes the determined stoichiometry (metal and carbon peaks have been combined using the known molecular structure of the matrix material). Also given in table 1 is the stoichiometry of a Cs doped BPhen layer typically used in OLEDs.

TABLE 1

|  | Cs:Ir(ppy)$_3$ | Cs:Alq | Cs:BPben |
|---|---|---|---|
| Cs | 3.2 (1.8 exp.) | 3.1 (1.8 exp) | 1 |
| Matrixmaterial | 1 | 1 | 8.1 |

In a still further embodiment doping of various matrices has been carried out using a Ga$_7$Cs$_{11}$ alloy. The compound was subjected to heating to 420° C. before use in order to create a protective Ga shell. A total of 15 doped samples have been prepared with one crucible filling (approx. 0.1 g equivalent of pure Cs). Still, no sign of exhaustion has occurred. The sublimation temperature for Cs is around 300° C. This corresponds to an equivalent of about 100 nm of pure Cs in the doped films (source—sample distance approx. 25 cm). Additionally, further Cs is wasted before and after the experiment.

It was estimated that the 0.1 g equivalent of pure Cs should be sufficient for 3000 nm total layer thickness of Cs. Table 2 shows examples for the doping process according to this embodiment.

TABLE 2

|  | Nominal doping concentration Cs:BPhen | Corrected doping concentration Cs:BPhen | Conductivity (S/cm) |
|---|---|---|---|
| Cs:BPhen prepared using GaCs alloy | 1:9 | 1:5 | 6.7e−5 |
|  | 1:7.5 | 1:4 | 7.6e−5 |
|  | 1:18 | 1:10 | 1.5e−6 |
| Cs:BPhen prepared using S.A.E.S. getter |  | 1:8 | 5e−5 |

Nominal doping concentrations determined from QMB readout, corrected values include non-unity sticking coefficient of Cs Electrical doping as described above can be advantageously performed by means of a standard evaporator or crucible as used for organic material deposition in vacuum. One preferred evaporator design is of the so called Knudsen type which comprises an electrical heated cylindrical crucible usually used as a point source where a large distance between crucible and the substance to be doped is provided. The Knudsen type evaporator can be extended linearly to provide a linear source.

An alternative linear source comprises a linear evaporator head with holes. The head is connected to an independently heated volume via a heated tube system. Material released from the crucible inside the heated volume is transported through the tube system to the linear evaporator head and released through the holes towards the substance to be doped. In such evaporator the Cesium alloy can be handled as a standard organic material. The crucible can be heated to about 420° C. or less, preferably to about 300° C. or less to release Cesium vapor. The heated tube system and the linear head can be operated at temperatures above the crucible temperature (up to 50° C.) until down to 50° C.

The temperature of the tube system can be kept at a lower temperature than the sublimation temperature in the crucible volume to avoid chemical reactions. Thus less energy is consumed during electrical doping process.

The features disclosed in this specification, claims and/or the figures may be material for the realization of the invention in its various embodiments, taken in isolation or in various combinations thereof.

The invention claimed is:

1. A method for electrical doping a semiconductor material with Cesium, wherein said semiconductor material is exposed to a Cesium vapor, characterized in that said Cesium vapor is provided by Cesium sublimation from a Cesium alloy.

2. The method as claimed in claim 1, wherein said Cesium vapor is provided by Cesium sublimation from a Gallium Cesium alloy.

3. The method as claimed in claim 2, wherein said Cesium vapor is provided by Cesium sublimation from a Ga$_7$Cs$_{11}$ alloy.

4. The method as claimed in claim 1, wherein said semiconductor material is provided as a thin film material.

5. The method as claimed in claim 1, wherein said Cesium sublimation is performed in an evaporator at a sublimation temperature of about 420° C. or less.

6. The method as claimed in claim 5, wherein said Cesium sublimation is monitored by a quartz microbalance.

7. The method as claimed in claim 6, wherein said quartz microbalance is cooled by water.

8. The method as claimed in claim 1, wherein said Cesium alloy is provided as a solid material, and said solid material is preheated for generating a protective shell.

9. The method as claimed in claim 1, wherein said semiconductor material is an organic material.

10. The method as claimed in claim 1, wherein said semiconductor material is an organic electron transport material.

11. The method as claimed in claim 1, wherein said Cesium vapor is provided by Cesium sublimation from a standard organic material deposition evaporator.

12. The method as claimed in claim 11, wherein said standard organic material deposition evaporator is a Knudsen type crucible.

13. The method as claimed in claim 11, wherein said standard organic material deposition evaporator is linear source type.

14. The method as claimed in claim 11, wherein said standard organic material deposition evaporator is an evaporator with a linear head connected to a crucible volume by a tube system.

15. The method as claimed in claim 14, wherein a temperature of said tube system of said standard organic material deposition evaporator is controlled to be below a temperature in said crucible volume.

16. The method as claimed in claim 1, wherein said Cesium sublimation is performed in an evaporator at a sublimation temperature of about 300° C. or less.

* * * * *